(12) United States Patent
Spahlinger

(10) Patent No.: US 8,171,794 B2
(45) Date of Patent: May 8, 2012

(54) OPERATING METHOD AND CIRCUIT ARRANGEMENT FOR A CAPACITIVE MICROMECHANICAL SENSOR WITH ANALOG RESET

(75) Inventor: Guenter Spahlinger, Stuttgart (DE)

(73) Assignee: Northrop Grumman LITEF GmbH, Freiburg (DE)

( * ) Notice: Subject to any disclaimer, the term of this patent is extended or adjusted under 35 U.S.C. 154(b) by 266 days.

(21) Appl. No.: 12/451,879

(22) PCT Filed: Mar. 14, 2008

(86) PCT No.: PCT/EP2008/002059
§ 371 (c)(1),
(2), (4) Date: Dec. 4, 2009

(87) PCT Pub. No.: WO2008/151683
PCT Pub. Date: Dec. 18, 2008

(65) Prior Publication Data
US 2010/0132466 A1      Jun. 3, 2010

(30) Foreign Application Priority Data
Jun. 15, 2007    (DE) .......................... 10 2007 027 652

(51) Int. Cl.
*G01P 15/125*    (2006.01)
(52) U.S. Cl. ..................................... 73/514.32; 324/661
(58) Field of Classification Search ............... 73/1.38,
73/514.32, 780, 862.626; 324/661, 662,
324/686
See application file for complete search history.

(56) References Cited

U.S. PATENT DOCUMENTS 7,109,727 B2 * 9/2006 Hayakawa et al. ........... 324/679
7,131,315 B2 * 11/2006 Rojo et al. ..................... 73/1.38

FOREIGN PATENT DOCUMENTS

| CA | 1 130 364 C | 2/1995 |
| DE | 3831593 | 3/1990 |
| DE | 19959128 | 6/2000 |
| DE | 19929767 | 1/2001 |
| DE | 102004039924 | 2/2006 |
| DE | 102005044383 | 3/2006 |
| JP | 52-142131 A | 11/1977 |
| JP | 08-062248 A | 3/1996 |
| JP | 08-178955 A | 7/1996 |
| JP | 2000-333488 A | 11/2000 |
| JP | 2001-033330 A | 2/2001 |

OTHER PUBLICATIONS

Office action dated Dec. 1, 2010 in Australian patent application 2008261367.
Office action dated Oct. 21, 2010 in Canadian patent application 2,687,127.

* cited by examiner

*Primary Examiner* — Huy Q Phan
*Assistant Examiner* — Alesa Allgood
(74) *Attorney, Agent, or Firm* — Elliot N. Kramsky

(57) ABSTRACT

A method and a switch arrangement for operating a micromechanical capacitive sensor having at least one and at most two fixed electrodes and one differential capacitor formed by a movable central electrode that can be deflected by an external force, wherein the deflection of the electrode is measured. A fraction of the force acting on the central electrode, corresponding to the electrostatic restorative force, is compensated. Under closed-loop operation, a selection signal is influenced by a regulator supplementing a restore crosstalk signal so that the created capacitive restorative force acts in a compensatory manner against deflection of the central electrode.

14 Claims, 4 Drawing Sheets

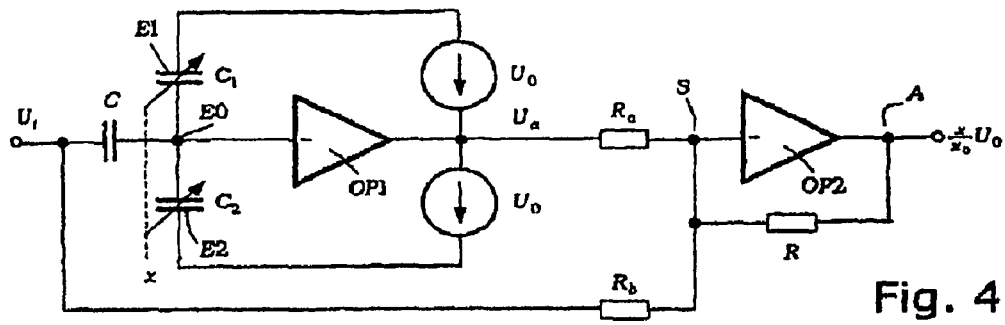
Fig. 4
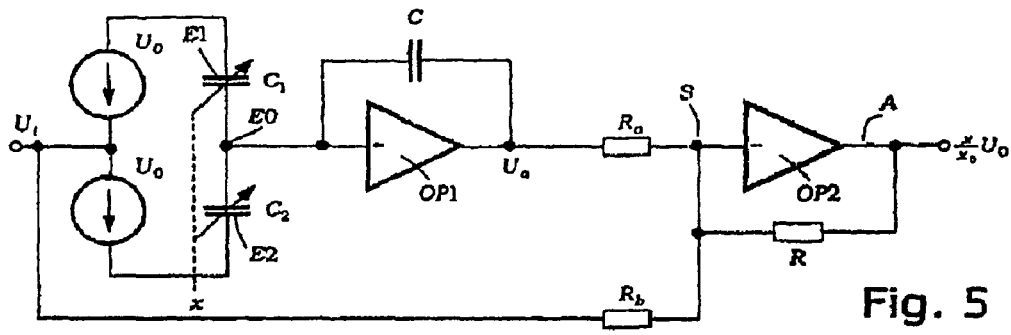
Fig. 5
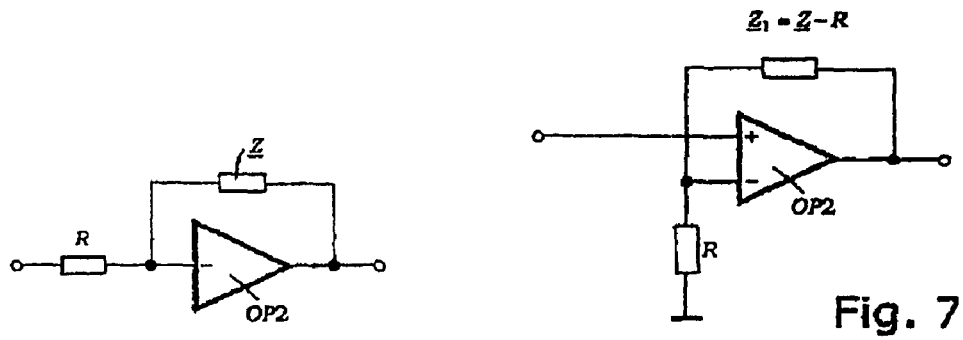
Fig. 6
Fig. 7

US 8,171,794 B2

OPERATING METHOD AND CIRCUIT ARRANGEMENT FOR A CAPACITIVE MICROMECHANICAL SENSOR WITH ANALOG RESET

BACKGROUND

1. Field of the Invention

The invention relates to micromechanical sensors (also referred to as MEMS sensors) such as micromechanical accelerometers, micromechanical rate of rotation sensors and micromechanical sensors with comb drives.

More particularly, this invention pertains to an operating method and circuit for operating a capacitive micromechanical sensor having at least one differential capacitor formed by two stationary electrodes and a movable center electrode arranged between the latter and suspended in a resilient manner that can be deflected by an external force whose deflection is measured with opposite and equal excitation voltages being applied between the stationary electrodes and the center electrode.

2. Description of the Prior Art

In its basic variant, a MEMS sensor comprises a differential capacitor whose center electrode is resiliently suspended to react, with deflection, to forces acting upon it. The deflection is measured by corresponding known circuit measures. In a resetting system (closed-loop arrangement), the measured value is supplied to a controller that influences electrostatic forces acting on the plates of the differential capacitor to compensate the external acceleration force. This operation is referred to as a reset. The reset is perfect if the deflection of the center electrode becomes "0".

SUMMARY AND OBJECTS OF THE INVENTION

It is the object of the invention to improve the accuracy of MEMS sensors.

The present invention addresses the preceding object by providing, in a first aspect, an operating method for a capacitive micromechanical sensor. Such a sensor has at least one differential capacitor formed by two stationary electrodes. A movable center electrode is arranged between the electrodes and is suspended in a resilient manner. The electrode can be deflected by an external force. Opposite excitation voltages are applied between the stationary electrodes and the center electrode and the deflection of the center electrode is measured.

A proportion of the charge that can be tapped off at the center electrode is compensated for. Such proportion corresponds to the electrostatic restoring force and is referred to as the reset crosstalk.

In a second aspect, the invention provides a circuit arrangement for operating a micromechanical sensor having at least one differential capacitor formed by two stationary electrodes and a center electrode. The electrode is movably suspended in a resilient manner between the electrode and can be deflected by an external force. The circuit arrangement has means for applying a respective excitation voltage of opposite polarity to the two stationary electrodes as well as means for outputting the deflection of the center electrode in the form of a measured value during the action of a force.

In the invention, a device is provided for compensating for the electrostatic restoring force (referred to as the reset crosstalk) at the center electrode.

The foregoing and other features of the invention will be set forth in the detailed description that follows. Such description is accompanied by a set of drawing figures in which numerals identify the features of the invention. Numerals of the drawing figures correspond to those of the written description with like numerals referring to like features throughout.

BRIEF DESCRIPTION OF THE DRAWINGS

FIG. 1 is a schematic diagram of a first basic circuit of a capacitive MEMS sensor with a differential capacitor, in which a reference capacitor C may be formed by two variable capacitances which are connected in parallel as illustrated in FIG. 1a;

FIG. 4 is a schematic diagram of a first embodiment for compensation of reset crosstalk, illustrated employing the basic circuit of FIG. 1 when implementing the arrangement of FIG. 3;

FIG. 5 is a schematic diagram of a possible implementation of compensation for reset crosstalk in accordance with FIG. 3 employing the basic sensor circuit of FIG. 2;

FIG. 6 is a schematic diagram of a basic inverting controller that can be employed for the embodiment (using dashed lines of FIG. 3) of a sensor operated in a closed loop;

FIG. 7 illustrates the basic circuit of a noninverting controller;

DETAILED DESCRIPTION OF THE PREFERRED EMBODIMENT

Figure 1:
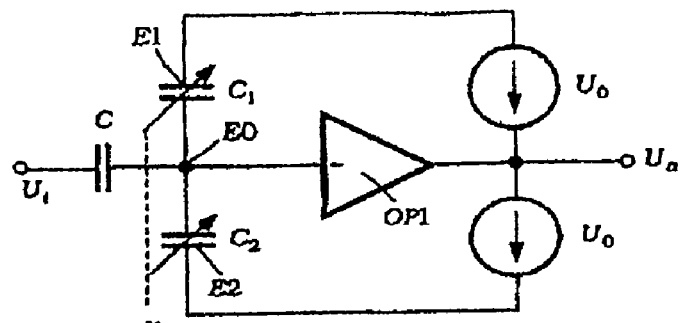

The invention is based on the knowledge that the force acting on the deflection of the center electrode of a differential capacitor is composed of an (external) acceleration force and an (internal) electrostatic force (restoring force). Based on this knowledge, in an operating method for a capacitive micromechanical sensor of the generic type mentioned above, the invention involves, on the one hand, compensating for a component that corresponds to the electrostatic restoring force. This is referred to as the "reset crosstalk" and is superimposed on the read-out signal (measured value).

Based on an arrangement for operating a micromechanical sensor which is formed by at least one differential capacitor having two stationary electrodes and a center electrode which is movably suspended in a resilient manner between the latter and can be deflected by an external force, such arrangement having means for applying an excitation voltage of opposite polarity to the two stationary electrodes and having means for outputting the deflection of the center electrode during the action of a force in the form of a measured value, the invention is characterized, on the other hand, by a device for compensating for distortion of the measured value (read-out signal), which distortion is referred to as the "reset crosstalk".

In one preferred embodiment of the operating method, a signal corresponding to the reset crosstalk is added to the output signal from a basic arrangement of the micromechanical sensor and the result of the addition is provided in the form of a read-out signal which indicates deflection of the center electrode. During preferred closed-loop operation of the sensor, the read-out signal additionally influences the reset crosstalk signal via a controller in such a manner that the resultant capacitance of the restoring force counteracts a deflection of the center electrode in a compensating manner.

In order to prevent drift of the read-out signal from the sensor arrangement, it is advantageous to continuously reverse the polarity of the excitation voltage applied to the stationary electrodes according to a deterministic or stochastic polarity reversal method.

An inventive circuit arrangement for operating a micromechanical sensor of the generic type mentioned above is characterized, according to the invention, by a device for compensating for the distortion of the measured value, referred to as the reset crosstalk. The measured value from the sensor is output, for example, in the form of a voltage value, in which case it is advantageous to provide summation that adds a reset voltage value, corresponding to the reset crosstalk, to an output voltage value provided by the basic arrangement of the sensor. A controller may be provided in this case, a read-out signal which has been freed from reset crosstalk being applied to the input of the controller and the controller adjusting the reset voltage value in the case of deflection of the center electrode in such a manner that a capacitive restoring force generated counteracts the deflection of the center electrode.

The controller may be a proportional controller (P controller) or a proportional-integral controller (PI controller), each with a frequency-dependent gain. A PI controller is advantageously formed by an operational amplifier having a complex feedback path formed by the series connection of a nonreactive resistor and a capacitance. If provision is made for preventing drift of the read-out signal by deterministically or stochastically reversing the polarity of the excitation voltage at the stationary electrodes of the differential capacitor, as mentioned, the polarity of the capacitance in the complex feedback impedance of the PI controller should be able to be correspondingly reversed.

Figure 2:
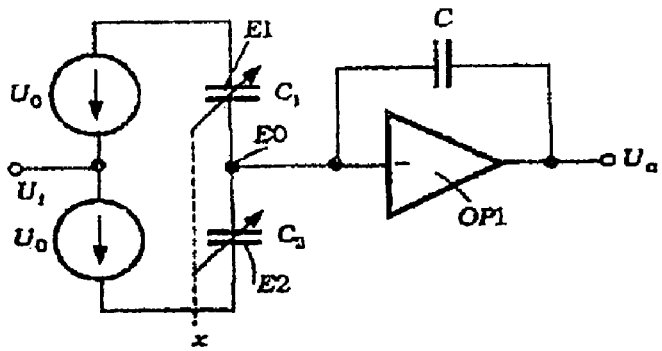
FIG. 2 is a schematic diagram of the basic circuit of FIG. 1 for operating a MEMS sensor with a differential capacitor.

The schematic diagrams of FIGS. 1 and 2 illustrate two basic circuits that provide the read-out function for the deflection x of a movable center electrode E0 of a MEMS sensor. The circuits allow a predefined restoring force to be impressed on the movable center electrode E0. Concepts for a complete closed-loop control loop are described below.

FIG. 1 illustrates a first basic circuit of a capacitive MEMS sensor having a hermetically encapsulated differential capacitor (cf. FIG. 12 below). The differential capacitor formed by the capacitances $C_1$ and $C_2$ located between stationary electrodes E1 and E2 and a resiliently suspended center electrode E0 responds to a deflection x of the resiliently suspended center electrode E0, the linearized dependence being represented by $$C_1 = \frac{C_0}{2}\left(1 + \frac{x}{x_0}\right) \tag{1a}$$

$$C_2 = \frac{C_0}{2}\left(1 - \frac{x}{x_0}\right). \tag{1b}$$

Figure 1A:
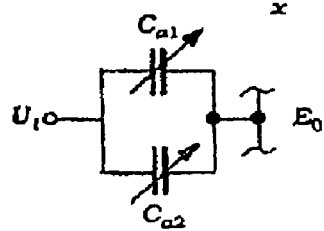

The same excitation voltage $U_0$—with opposite polarity—is applied to the stationary electrodes E1 and E2 toward the output of an operational amplifier OP1 having input connected to the center electrode E0. The output of the operational amplifier OP1 provides an output voltage value $U_a$. A voltage $U_i$, whose significance is explained below, is also applied to the center electrode E0 via a reference capacitor C. In order to achieve a bridge balance that is independent of deflection of the center electrode E0, temperature and aging, it is particularly advantageous to form the reference capacitor C by connecting two variable capacitances $C_{a1}(x)$ and $C_{a2}(x)$ in parallel (refer to FIG. 1a), which capacitance values change in response to the deflection x.

$$C(x) = C_{a1}(x) + C_{a2}(x) \tag{2}$$

If $C_{a1}(x) \sim C_1(x)$ and $C_{a2}(x) \sim C_2(x)$ are selected, the following applies $$\frac{C(x)}{C_0(x)} = \frac{C_{a1}(x) + C_{a2}(x)}{C_1(x) + C_2(x)} = const. \tag{2a}$$

irrespective of deflection.

This measure is suitable for all MEMS sensors with reset crosstalk, including micromechanical Coriolis gyroscopes.

The read-out and reset functions of the first basic circuit of a MEMS sensor with a differential capacitor are analyzed below.

With reference to FIG. 1, the following applies to the charges $Q_1$, $Q_2$ in the differential capacitor:

$$Q_1 = C_1(U_a + U_0) \tag{3}$$

$$Q_2 = C_2(U_a - U_0) \tag{4}$$

For the reference capacitor C $$Q = CU_i \tag{5}$$

The common circuit node (i.e., the center electrode E0) is at virtual ground. According to Kirchhoff's law, $$Q + Q_1 + Q_2 = 0 \tag{6}$$

applies to an ideal operational amplifier OP1 when the initial charge disappears. It follows from equations (3) to (6) that $$C_1(U_a + U_0) + C_2(U_a - U_0) = -CU_i \tag{7}$$

or with equations (1) and (2)

$$\frac{C_0}{2}\left(1 + \frac{x}{x_0}\right)(U_a + U_0) + \frac{C_0}{2}\left(1 - \frac{x}{x_0}\right)(U_a - U_0) = -CU_i \tag{8}$$

$$\left(1 + \frac{x}{x_0}\right)(U_a + U_0) + \left(1 - \frac{x}{x_0}\right)(U_a - U_0) = -U_i\frac{2C}{C_0} \tag{9}$$

$$U_a + \frac{x}{x_0}U_0 = -U_i\frac{C}{C_0} \tag{10}$$

$$U_a = -\frac{x}{x_0}U_0 - U_i\frac{C}{C_0} \tag{11}$$

In equations (1) to (11), $x_0$ denotes the reference point for deflection x and $C_0$ denotes the sum of the two partial capacitances $C_1$, $C_2$ in the quiescent position of the differential capacitor (x=0). The term $U_a$ for the output voltage of the basic sensor arrangement is composed of two parts, as equation (11) reveals. The first part is the read-out function which depends on deflection x. The second part depends on $U_i$, a measure of the internal electrostatic force (restoring force), as is shown in the next section and is used to reset the sensor. This second (undesirable) part is called the reset crosstalk.

The reset function is explained in greater detail below:

For the voltages across the differential capacitor, the following applies to the capacitor element $C_1$:

$$U_1 = U_a + U_0 \quad (12)$$

and the following applies to the capacitor element $C_2$:

$$U_2 = U_a - U_0 \quad (13)$$

Electrostatic forces which act, in total, on the movable electrode E0 of the differential capacitor result as follows:

$$F = \frac{U_1^2}{2}\frac{dC_1}{dx} + \frac{U_2^2}{2}\frac{dC_2}{dx} \quad (14)$$

$$= (U_1^2 - U_2^2)\frac{1}{4}\frac{C_0}{x_0} \quad (15)$$

$$= (U_1 - U_2)(U_1 + U_2)\frac{1}{4}\frac{C_0}{x_0} \quad (16)$$

$$F = U_0 U_a \frac{C_0}{x_0} \quad (17)$$

$$F = -U_0 U_i \frac{C}{x_0} - U_0^2 \frac{xC_0}{x_0^2} \quad (18)$$

The electrostatic force F is composed of a part that depends on $U_i$, the internal electrostatic force, and a (undesirable) part, that depends on the deflection x, corresponds to the external acceleration force and is determined by a negative spring constant.

FIG. 2 is a schematic diagram of a second basic circuit for operating a MEMS sensor with a differential capacitor. The reference capacitor C is parallel to the operational amplifier OP1 as a direct feedback path. A mathematical analysis reveals that the voltages $U_i$ and $U_a$ have essentially changed roles when contrasted with the basic circuit according to FIG. 1.

The following applies to the read-out function:

$$U_a = -\frac{x}{x_0} U_0 \frac{C_0}{C} - U_i \frac{C_0}{C} \quad (19)$$

In this case, the first term of the read-out voltage $U_a$ of the basic sensor arrangement denotes the read-out function that depends on the deflection x and the second term denotes the reset crosstalk.

The following applies to the reset function of the part that relates to the internal electrostatic force (similar to equation (17)):

$$F = U_0 U_i \frac{C_0}{x_0} \quad (20)$$

Compensation for the reset crosstalk according to the invention is described in more detail below.

As is clear from equations (11) and (19), the two circuit variants according to FIGS. 1 and 2 provide, at their output, a read-out voltage $U_a$ which, in addition to a component determined by deflection x, also contains the component that is referred to as the reset crosstalk and depends on $U_i$. If the MEMS sensors are intended to operate satisfactorily during closed-loop operation, it is necessary to compensate for this crosstalk. Without restricting generality, $C=C_0$. The following then results, in both cases, from equations (11) and (19):

$$U_a = -\frac{x}{x_0} U_0 - U_i \quad (21)$$

Figure 3:
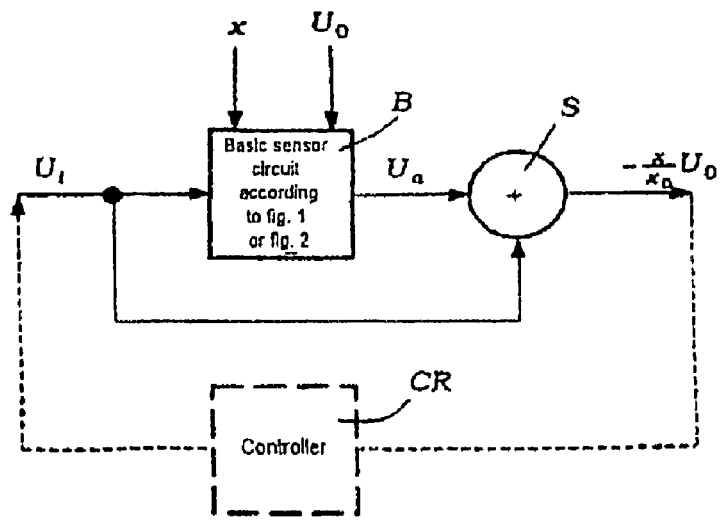
FIG. 3 is a basic block diagram illustrating compensation for so-called reset crosstalk in accordance with the invention.

If the basic block diagram of FIG. 3, including a basic sensor circuit B according to FIG. 1 or FIG. 2 with the input variables of deflection x and excitation voltage $U_0$ is considered, a read-out signal which has been freed from $U_i$ of magnitude $$-\frac{x}{x_0} U_0$$

is obtained if the reset voltage $U_i$ is added to the output signal $U_a$ from the basic sensor circuit at a summation point S. If the read-out signal $$-\frac{x}{x_0} U_0$$

is additionally applied to a controller CR, closed-loop operation results, as depicted by the dashed addition in FIG. 3.

The circuit examples of FIGS. 4 and 5 show how reset crosstalk can be compensated in the circuits according to FIGS. 1 and 2, respectively. (The components and functions, which have already been explained with reference to FIGS. 1 and 2 are not described again.) The reset voltage $U_i$ is added at the summation point S. The read-out signal $$U_x = \frac{x}{x_0} U_0$$

with correct mathematical sign is obtained at the output A by means of a decoupling operational amplifier OP2.

During closed-loop operation, the controller must operate correctly, i.e., when a deflection x occurs $U_i$ must be adjusted so that the resultant restoring force counteracts the deflection. This means that the circuit of FIG. 4 requires a noninverting controller and the circuit FIG. 5 requires an inverting controller.

If the reference capacitor C, the differential capacitor $C_0$ formed by the partial capacitances $C_1$, $C_2$ and the individual resistors $R_a$, $R_b$ are implemented in the same technology, the balancing condition $C/C_0 = R_a/R_b$ can be complied with well over time and in the event of temperature fluctuations.

Figure 8:
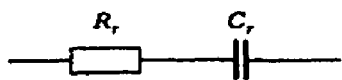
FIG. 8 illustrates a preferred impedance in the feedback path when a PI controller is employed in a closed-loop arrangement of the MEMS sensor.

One implementation for the controller during closed-loop operation is described below:

The controller must insure that a deflection x is counteracted. This controller essentially comprises an amplifier of gain $\alpha$, which possibly depends on frequency. The controller can then be, for example, in the form of a proportional controller (P controller) with a frequency-independent gain $\alpha$ or in the form of a proportional-integral controller (PI controller) with a frequency-dependent gain ($\alpha=\beta+1/j\omega\gamma$). The controller must additionally provide the correct mathematical sign of the gain. That is, it is necessary to distinguish between an inverting controller (FIG. 6) and a noninverting controller (FIG. 7). The gain of the operational amplifier OP2 results from $$\alpha = \pm \frac{Z}{R}, \quad (22)$$

where the negative mathematical sign (−) applies to the controller in FIG. 6 and the positive mathematical sign (+) applies to the controller of FIG. 7. $\underline{Z}$ describes a (complex) impedance that generally depends on frequency and can be used to set the controller characteristic. For a proportional controller (according to FIG. 6), a nonreactive resistor is used for $\underline{Z}$, whereas a series circuit comprising a nonreactive resistor $\overline{R}_r$ and a capacitor $C_r$ (cf. FIG. 8) should be provided, in particular, for a proportional-integral controller.

It should be mentioned that bias currents of the operational amplifier OP1 on the left in the figures may result in zero point drift. According to an advantageous addition to the invention, this can be overcome by reversing the polarity of the excitation voltage $U_0$, (e.g., at regular intervals) and by employing a very large resistor $R_\infty$ leading from the output of the operational amplifier OP1 to the inverting input of the latter. As described above, the mathematical sign of $U_0$ is included in both the read-out factor and the mathematical sign of the force, with the result that the mathematical sign of the controller remains unchanged. The polarity of $U_0$ may be reversed either periodically or according to a random or pseudo-random function. The bias current for the operational amplifier OP1 is then determined.

Figure 9:
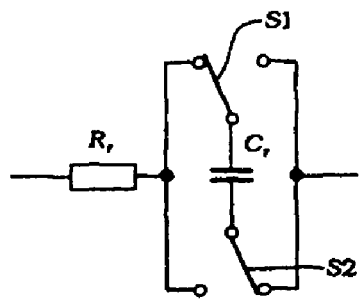
FIG. 9 illustrates the impedance for a PI controller, corresponding to FIG. 8, with a capacitor whose polarity can be reversed when deterministically or stochastically reversing the polarity of the excitation voltage across the differential capacitor.

In the event that the polarity of $U_0$ is reversed in accordance with a particular function for the reasons mentioned, the polarity of the capacitor $C_r$ of the impedance of the PI controller must also be reversed according to the same function, resulting in the circuit of FIG. 9.

The combination of compensation for the reset crosstalk and control during closed-loop operation of the MEMS sensor is described below for a particularly advantageous embodiment of the invention.

Figure 10:
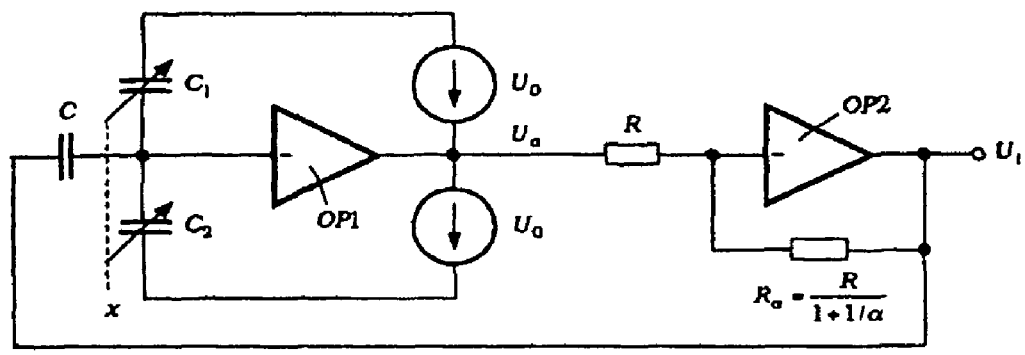
FIG. 10 is a schematic diagram of a first exemplary embodiment of a combination of control and compensation in a closed-loop arrangement for a MEMS sensor having features according to the invention.

The functions of compensation for the reset crosstalk and control can be advantageously combined. FIG. 10 is a schematic diagram of the circuit structure that results in this case for the first circuit variant according to FIG. 1. In this case, a resistance $$R_\alpha = \frac{R}{1+1/\alpha} < R \quad (23)$$

sets the gain $\alpha$ of the controller. This becomes infinite for $R_\alpha=R$. It should be noted that the stated relationships apply only for $C=C_0$. If this condition is not satisfied, $R_\alpha$ must be scaled accordingly.

Figure 11:
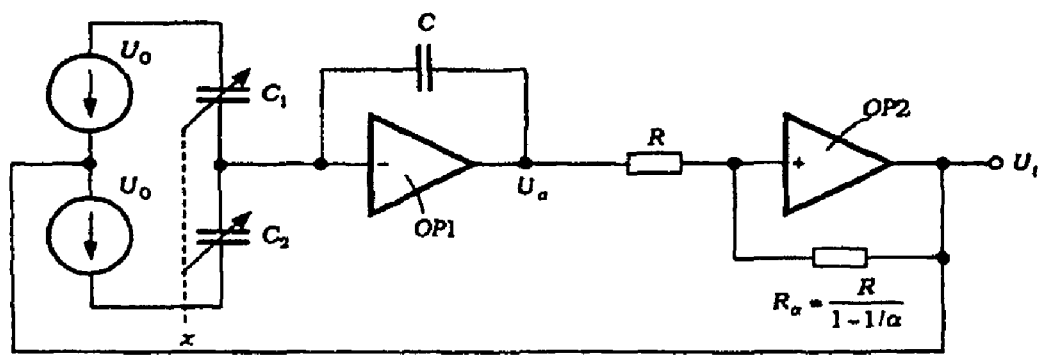
FIG. 11 is a schematic diagram of a second circuit arrangement corresponding to the combined control and compensation of the circuit of FIG. 10 employing the basic circuit of FIG. 2.

The circuit structure of FIG. 11 results in a very similar manner for the second basic circuit according to FIG. 2. In this case, the gain $\alpha$ of the controller is set using $$R_\alpha = \frac{R}{1-1/\alpha} > R; \quad (24)$$

It becomes infinite for $R_\alpha=R$.

It should be mentioned that, for both circuits according to FIGS. 10 and 11, it is necessary to satisfy a balancing condition that should be taken into account for the permissible tolerances of the components used.

Figure 12:
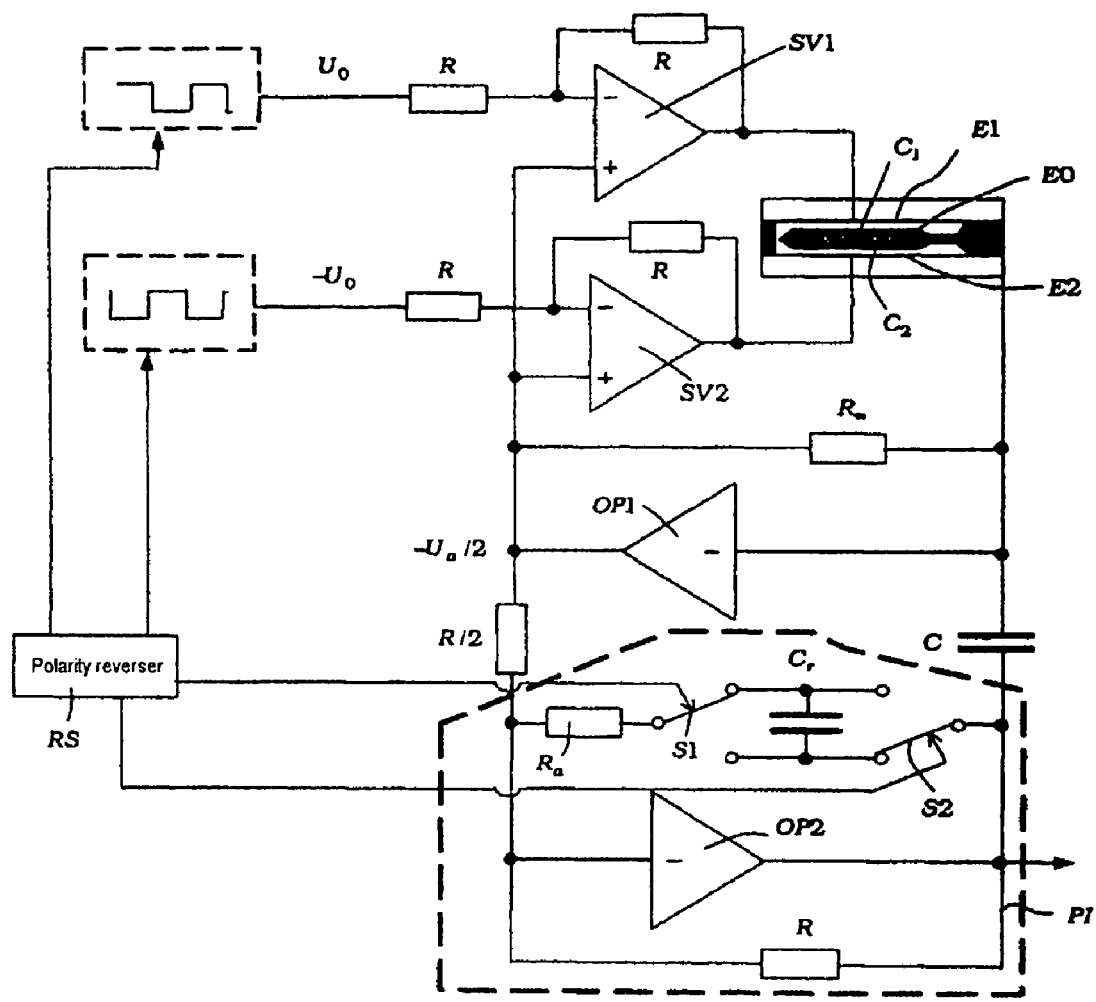
FIG. 12 illustrates a complete circuit arrangement for a resetting MEMS sensor with a PI controller and deterministic/stochastic polarity reversal of the excitation voltage and of the capacitor in the complex feedback impedance of a PI controller.

FIG. 12 illustrates a complete circuit as an exemplary embodiment of a resetting closed-loop MEMS sensor having features according to the invention. This exemplary embodiment is based on the first variant of the basic circuit according to FIG. 1 and has a PI controller with a complex feedback impedance according to FIG. 9. The excitation voltage $U_0$ provided, for the abovementioned reasons, by a polarity reverser RS, controlled periodically or according to a pseudo-random function, is not introduced here by potential-free voltage sources but rather via separate summing amplifiers SV1 and SV2. These summing amplifiers SV1, SV2 are in the control loop and have a gain of "2" for the latter. This additional gain is taken into account by corresponding dimensioning measures at another point in the circuit. The polarity reverser RS simultaneously activates switches S1, S2 for reversing the polarity of the capacitor $C_r$ of the impedance $\underline{Z}$ of the PI controller.

While the invention has been described with reference to a presently preferred embodiment, it is not limited thereto. Rather, this invention is limited only insofar as it is defined by the following set of patent claims and includes within its scope all equivalents thereof.

What is claimed is:

1. An operating method for a capacitive micromechanical sensor having at least one differential capacitor which is formed by two stationary electrodes and a movable center electrode which is arranged between the latter, is suspended in a resilient manner and can be deflected by an external force, opposite excitation voltages being applied between the stationary electrodes and the center electrode and the deflection of the center electrode being measured, characterized in that a proportion of the charge which can be tapped off at the center electrode is compensated for, which proportion corresponds to the electrostatic restoring force and is referred to as the reset crosstalk.

2. The operating method as claimed in claim 1, characterized in that a signal corresponding to the reset crosstalk is added to the output signal from the basic arrangement of the capacitive micromechanical sensor and the result of the addition is provided in the form of a read-out signal which indicates the deflection of the center electrode.

3. The operating method as claimed in claim 2, characterized in that, during closed-loop operation of the sensor, the read-out signal additionally influences the reset crosstalk signal via a controller in such a manner that the resultant capacitive restoring force counteracts a deflection of the center electrode in a compensating manner.

4. The operating method as claimed in claim 2, characterized in that drifting of the zero point of the sensor is prevented by deterministically reversing the polarity of the excitation voltage.

5. The operating method as claimed in claim 2, characterized in that drifting of the zero point of the sensor is prevented by stochastically reversing the polarity of the excitation voltage.

6. The operating method as claimed in claim 3, characterized in that a PI controller is used to generate the capacitive restoring force.

7. A circuit arrangement for operating a micromechanical sensor having at least one differential capacitor formed by two stationary electrodes and a center electrode which is movably suspended in a resilient manner between the latter and can be deflected by an external force, said arrangement having means for applying a respective excitation voltage of opposite polarity to the two stationary electrodes and having means for outputting the deflection of the center electrode during the action of a force in the form of a measured value, characterized by a device for compensating for the electrostatic restoring force, which is referred to as the reset crosstalk, at the center electrode.

8. The circuit arrangement as claimed in claim 7, in which the measured value is output in the form of a voltage value, characterized by a device for summing a reset voltage value corresponding to the reset crosstalk and an output voltage value provided by a basic arrangement of the sensor.

9. The circuit arrangement as claimed in claim 8, having a controller, a read-out signal which has been freed from reset crosstalk being applied to the input of said controller and said controller adjusting the reset voltage value in the case of deflection of the center electrode in such a manner that a capacitive restoring force generated thereby counteracts the deflection of the center electrode.

10. The circuit arrangement as claimed in claim 9, characterized by a deterministically or stochastically controlled polarity reversal device for the excitation voltage.

11. The circuit arrangement as claimed in claim 10, characterized in that the controller is a P controller with a frequency-independent gain.

12. The circuit arrangement as claimed in claim 10, characterized in that the controller is a PI controller with a frequency-dependent gain.

13. The circuit arrangement as claimed in claim 12, characterized in that the PI controller is formed by an operational amplifier having a complex feedback path formed by connecting a nonreactive resistor and a capacitance in series.

14. The circuit arrangement as claimed in claim 10, characterized in that the controller is a PI controller with a frequency-dependent amplifier, formed by an operational amplifier having a series circuit comprising a nonreactive resistor and a capacitance whose polarity can be reversed by a polarity reversal switch, the polarity reversal switch being able to be activated by the polarity reversal device for the excitation voltage.

* * * * *